US008829919B2

(12) United States Patent
Alho

(10) Patent No.: US 8,829,919 B2
(45) Date of Patent: Sep. 9, 2014

(54) METHOD AND SYSTEM FOR MONITORING THE CONDITION OF CAPACITORS IN A DC-VOLTAGE INTERMEDIATE CIRCUIT

(75) Inventor: Timo Alho, Laihia (FI)

(73) Assignee: The Switch Drive Systems Oy, Lappeenranta (FI)

( * ) Notice: Subject to any disclaimer, the term of this patent is extended or adjusted under 35 U.S.C. 154(b) by 418 days.

(21) Appl. No.: 12/863,753

(22) PCT Filed: Jan. 15, 2009

(86) PCT No.: PCT/FI2009/050022
§ 371 (c)(1),
(2), (4) Date: Jul. 20, 2010

(87) PCT Pub. No.: WO2009/092848
PCT Pub. Date: Jul. 30, 2009

(65) Prior Publication Data
US 2010/0295554 A1    Nov. 25, 2010

(30) Foreign Application Priority Data
Jan. 21, 2008  (FI) ..................................... 20085047

(51) Int. Cl.
*G01R 31/12*    (2006.01)
*G01R 31/42*    (2006.01)
*G01R 31/02*    (2006.01)
(52) U.S. Cl.
CPC .............. *G01R 31/42* (2013.01); *G01R 31/028* (2013.01)
USPC ........................................................ 324/548
(58) Field of Classification Search
None
See application file for complete search history.

(56) References Cited

U.S. PATENT DOCUMENTS 4,331,994 A * 5/1982 Wirth ............................... 361/56
5,471,125 A * 11/1995 Wu ................................ 318/803
(Continued)

FOREIGN PATENT DOCUMENTS

EP    1 814 214 A1    8/2007
JP    3-22821 A       1/1991
(Continued)

OTHER PUBLICATIONS

Aeloiza et al., "A Real Time Method to Estimate Electrolytic Capacitor Condition in PWM Adjustable Speed Drives and Uninterruptible Power Supplies", IEEE, 2005, pp. 2867-2872.
(Continued)

*Primary Examiner* — Vinh Nguyen
(74) *Attorney, Agent, or Firm* — Birch, Stewart, Kolasch & Birch, LLP

(57) ABSTRACT

Method and system for monitoring the condition of the capacitor arrangement (14-16) of the DC-voltage intermediate circuit of a power electronics appliance, such as of a frequency converter, at the place of usage, in which method the discharge voltage over the capacitor arrangement as a function of time is measured, and in which method the intermediate circuit is pre-charged with a pre-determined DC voltage, the pre-charging is removed from the intermediate circuit, the voltage of the intermediate circuit is measured by sampling at regular intervals, the voltage drop as a function of time is determined on the basis of the measured voltage of the intermediate circuit, the capacitance or the relative change in it is determined on the basis of the voltage drop, the value of the determined capacitance or of the relative change in it is compared to a pre-determined limit value on the basis of the voltage drop, and the necessary condition monitoring procedure is performed when the value determined with the measurement reaches the pre-determined limit value or is close to it.

16 Claims, 2 Drawing Sheets

(56) References Cited

U.S. PATENT DOCUMENTS

Figure 1:
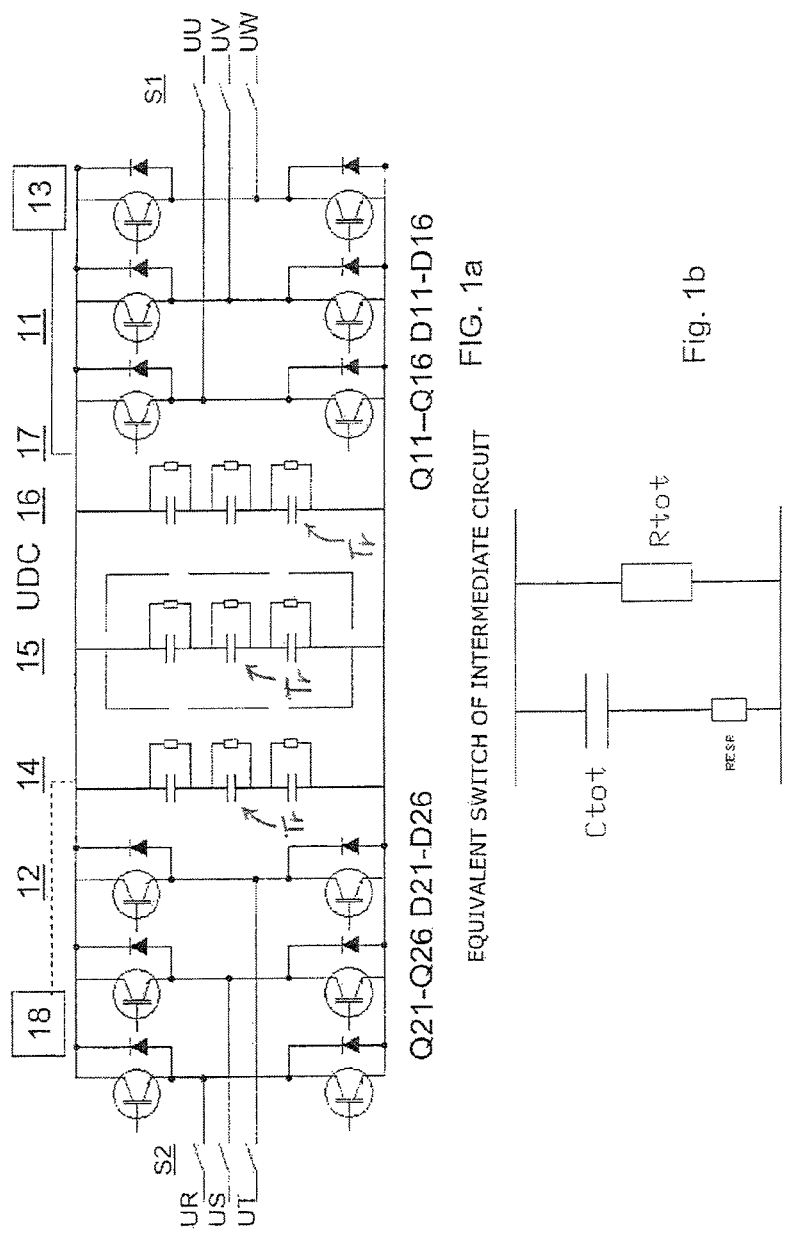

| | | | |
|---|---|---|---|
| 5,576,606 A * | 11/1996 | Nguyen Phuoc et al. | 318/801 |
| 5,804,973 A | 9/1998 | Shinohara et al. | |
| 6,741,482 B2 * | 5/2004 | Yamamoto et al. | 363/37 |
| 7,176,674 B2 * | 2/2007 | Karppinen et al. | 324/142 |
| 7,432,616 B2 * | 10/2008 | Hatai et al. | 307/66 |
| 7,688,603 B2 * | 3/2010 | Komulainen et al. | 363/37 |
| 7,733,048 B2 * | 6/2010 | Miettinen | 318/471 |
| 7,804,288 B2 * | 9/2010 | Ollila et al. | 324/76.11 |
| 2003/0053324 A1 * | 3/2003 | Yamamoto et al. | 363/127 |
| 2003/0067303 A1 * | 4/2003 | Huber et al. | 324/509 |
| 2005/0169018 A1 | 8/2005 | Hatai et al. | |

FOREIGN PATENT DOCUMENTS

| | | | |
|---|---|---|---|
| JP | 10-4626 A | | 1/1998 |
| JP | 2000-222025 A | | 8/2000 |
| JP | 2007-318838 | * | 12/2007 |
| JP | 2007-318838 A | | 12/2007 |

OTHER PUBLICATIONS

Kim et al., "Condition Monitoring of DC Link Electrolytic Capacitors in Adjustable Speed Drives", IEEE, 2007, pp. 237-243.

Lee et al., "Online capacitance estimation of DC-link electolytic capacitors for three-phase AC/DC/AC PWM converters using recursive least squares method", IEE Proceedings: Electric Power Applications, vol. 152, No. 6, Nov. 2005, pp. 1503-1508.

* cited by examiner

METHOD AND SYSTEM FOR MONITORING THE CONDITION OF CAPACITORS IN A DC-VOLTAGE INTERMEDIATE CIRCUIT

FIELD OF THE INVENTION

The object of this invention is a method for monitoring the condition of the capacitor unit of the DC-voltage intermediate circuit of a power electronics appliance, such as of a frequency converter.

The object of the invention is also a system for monitoring the condition of the capacitor unit of the DC-voltage intermediate circuit of a power electronics appliance, such as of an inverter.

BACKGROUND OF THE INVENTION

Generally the lifecycle of an apparatus utilizing power electronics, such as of a frequency converter, is determined by its capacitors, which are used in the DC-voltage intermediate circuit in particular for filtering noise voltages and also for storing electrical energy.

In frequency converters, large stresses are exerted on the capacitors of the DC-voltage intermediate circuit. Often unexpected destruction of a capacitor occurs, and it was not possible to anticipate its replacement. This further results in unwanted standstills in production and thus causes economic losses.

The ambient temperature, current ripple, high voltages and frequencies have a powerful impact on the lifetime of a capacitor. As a capacitor grows old its internal resistance increases, as also does the leakage current running through it, the capacitance decreases slowly over time. All these phenomena can be measured, but in practice they require opening of the appliance.

Manufacturers often define that a capacitor is at the end of its lifecycle when its capacitance has decreased by a certain relative amount.

The article E. C. Aeloiza; J-H Kim, P. Ruminot, P. N. Enjeti "A Real Time Method to Estimate Electrolytic Capacitor Condition in PWM Adjustable Speed Drives and Uninterruptible Power Supplies", pp. 2867-2872, IEEE 2005, presents a method to estimate the state of an electrolytic capacitor in variable PWM alternating current drives and in UPS apparatuses, in which method the state can be examined at the place of usage. The method is based on the fact that the wear of a capacitor results in variations in its internal equivalent serial resistance (ESR). In the method in question, the average power of the capacitor unit, or the RMS value of the current over it, is measured. A drawback of the method is its complexity and the large requirement for the computational power of the control electronics used in the measurement.

SUMMARY OF THE INVENTION

This invention discloses a new type of method for monitoring the condition of the capacitor pack of the intermediate circuit of a power electronics appliance provided with a frequency converter, an inverter or another direct-current intermediate circuit.

In the method and the system according to the invention the internal measurements that already exist in the frequency converter are utilized for monitoring the condition of the capacitor pack at the place of usage and thus the lifetime of the 1st unit of the capacitor pack is determined regularly and with the existing measurements in the DC intermediate circuit.

The method is based on the weakening of the ability to store charge caused by ageing of the capacitance. This is verified by performing a discharge test of the voltage of the intermediate circuit.

The characteristic features of the method and of the system according to the invention are described in detail in the claims below.

The method is simple, and does not require additional measurements in the system.

The advantage achieved is measurement data obtained via regular condition monitoring of the capacitor pack, as a result of which the remaining lifetime of the power electronics appliance can be estimated. It is possible to integrate many different properties into the monitoring software of the control unit, e.g. a warning notification, which indicates that the capacitance has dropped to the critical point or to below it.

SHORT DESCRIPTION OF THE DRAWINGS

Figure 2:
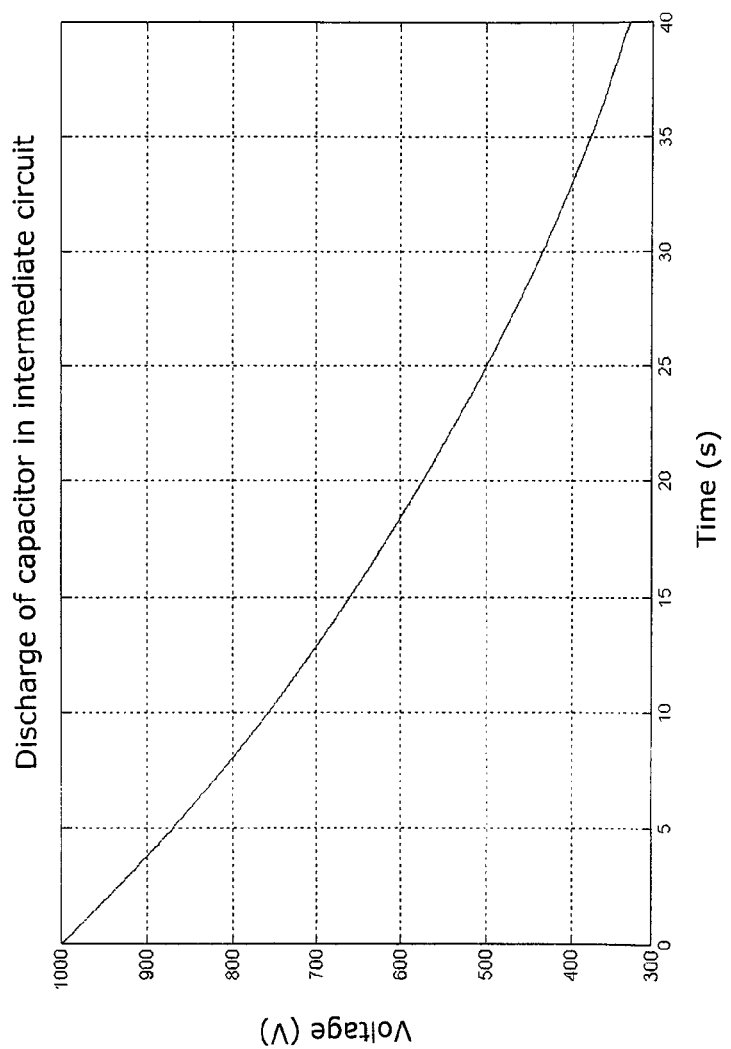

In the following, the invention will be described in more detail by the aid of an embodiment with reference to the attached drawings, wherein FIG. 1a presents a prior-art frequency converter supplied from a three-phase network, FIG. 1b presents the equivalent switch of the intermediate circuit of a frequency converter supplied from a three-phase network, and FIG. 2 presents the theoretical discharge curve of a capacitor.

DESCRIPTION OF PREFERRED EMBODIMENTS OF THE INVENTION

In the invention the internal measurements of the frequency converter are utilized for monitoring the condition of the capacitor pack at the place of usage and thus the lifetime of the 1st unit of the capacitor pack is determined regularly and with the existing measurements in the DC intermediate circuit.

FIG. 1 presents e.g. a frequency converter apparatus, which operates in four quadrants, connected to a three-phase alternating-current generator rotated by a wind rotor, with which three-phase alternating-current electricity, of which the phase voltages are $U_R$, $U_S$, $U_T$, is supplied e.g. via a network filter to a three-phase alternating-current electricity network.

The frequency converter comprises two inverter bridge units, the generator bridge 11 and the network bridge 12, the DC connections of which are connected to the direct-current intermediate circuit, which comprises a direct-current capacitor unit one and set of AC connections to the generator and a second set to the alternating-current electricity network via the network filter.

In the frequency converter presented in FIG. 1a the generator bridge 11 rectifies the three-phase alternating voltage of the generator, which comprises the phase voltages are $U_U$, $U_V$, $U_W$, into the DC voltage $U_{DC}$ of the DC intermediate circuit and the network bridge transforms the DC voltage of the DC intermediate circuit into three-phase alternating voltage that is suited to the alternating-current electricity network in terms of its amplitude and frequency. Each bridge is a six-pulse full-wave bridge, which comprises controllable semiconductor switches in each branch of the bridge, which controllable semiconductor switches are formed from e.g. the IGBTs according to FIG. 1a (Q11-Q16 and connected in parallel with them the diodes D11-D16 in the bridge 11, Q21-Q26 and D21-D26 in the bridge 12). The circuit allows also the passage of negative intermediate circuit current in the direction of the generator in braking situations.

It is possible to isolate the frequency converter from the network, as well as from the electrical machine, by means of the switches S1 and S2. The semiconductor switches are controlled with pulse-width modulation in the control unit 13 of the appliance.

The DC intermediate circuit comprises a capacitor unit, which comprises a number of capacitors in series and the parallel-connected capacitor packs 14-16, of which a part belong to the brake chopper unit 15.

In the frequency converter the voltage of the DC intermediate circuit is measured with an internal voltage measurement 17, which is connected to the control unit 13.

The following presents the capacitor unit and its operation

A capacitor is a component, which stores energy in an electrical field. In the intermediate circuit of a frequency converter, the property of a capacitor to decrease oscillation of the voltage of the intermediate circuit, as well as its ability to store energy, is utilized. In the intermediate circuit, capacitors are often connected in series, with which more voltage endurance is achieved, although total capacitance drops at the same time. The capacitance can be increased by connecting the capacitors in parallel to achieve the desired capacitance.

Mathematically the capacitors connected in series and in parallel and the trimmer resistors Tr connected in parallel with them can be presented simply as a serial circuit of a capacitor and a trimmer resistor Tr since the intermediate circuit is isolated from the network, as well as from the electrical machine, by means of breakers (FIG. 1$b$).

FIG. 1$b$ presents the equivalent circuit corresponding to the circuit of the capacitor pack of the DC intermediate circuit, in which $C_{tot}$ is the total capacitance, $R_{tot}$ the total resistance caused by the trimmer resistors Tr and $R_{esr}$ is the internal resistance of the capacitors.

According to Kirchoff's Voltage Law, we can write:

$$U_c + U_{ESR} + U_R = 0$$

$$U_c + (R_{ESR} + R_R)I_C = 0 \quad (1)$$

The dependency of the current on the change in the charge in relation to time $$I_C = \frac{dQ_C}{dt}$$

as well as the dependency of the change in the charge on the change in the voltage $dQ_C = C \cdot dU_C$ is placed into the equation (1)

Since $U_{ESR} \ll U_R$ then $U_{ESR}$ can be omitted from the trial.

After grouping, a first order differential equation is obtained:

$$RC\frac{dU_C}{dt} + U_C = 0 \quad (2)$$

The equation can be solved by making a trial function: $U_C = Ae^{rt}$

The initial value used is: $U_C(0) = U_{DCVoltage}$

The solution obtained for the equation is:

$$U_C + U_{DCVoltage} \cdot e^{\frac{-t}{RC}} \quad (3)$$

Now it is possible to solve the capacitance C, when the change in voltage ($\Delta U$) and the time (t) used for it are known. The frequency converter does not directly measure the voltage over the capacitor, but instead the total voltage over the intermediate circuit. The voltage loss from the effect of the internal resistance of the capacitor is insignificant compared to the inaccuracy of measurement, and therefore it can simply be assumed that $U_C \approx U_{DCVoltage}$.

When the voltage of the intermediate circuit drops by a certain relative amount from the time that charging of the intermediate circuit is stopped, it can be marked as $U_C = v \cdot U_{DCVoltage}$ The voltage of the capacitor can now be solved from the equation:

$$v \cdot U_{DCVoltage} = U_{DCVoltage} \cdot e^{\frac{-t}{RC}}$$

DC voltages can be omitted from the equation. When a semi-natural logarithm is also included and the equation is grouped slightly, the capacitance is solved.

$$C_{tot} = \frac{-t}{R_{tot} \cdot \ln v} \quad (4)$$

where "v" is the relative change in the DC voltage of the intermediate circuit, "t" is the discharge time related to it and "Rtot" is the total resistance of the trimmer resistors.

As an example, by means of the equation (3) the theoretical discharge curve of the capacitor pack can be drawn when the capacitance, the resistance of the discharge resistors, and also the DC voltage of the intermediate circuit are known (FIG. 2). Initial Values:
Capacitance C=3600 µF
Resistance R=10 kΩ
DC voltage U=1000V Since the manufacturing tolerances of capacitors and also of trimmer resistors vary, it is worth performing a discharge test for each appliance separately. Also the changing of the capacitance as well as of the resistance in relation to temperature must be taken into account. When the apparatus is instrumented at the factory the intermediate circuit can be precharged with the fitted DC voltage in a standard ambient temperature, which is in practice approx. 20° C. The precharging circuit 18 is removed from the intermediate circuit and how quickly the voltage of the intermediate circuit decreases is monitored with measurements. By means of this the capacitance of the intermediate circuit can be determined when the capacitors are new. The application software in the control unit manages the calculation of capacitance, which further can be recorded in a separate memory in the control unit. Instead of the absolute value of capacitance, the change in the relative capacitance is calculated. In this case the resistance of the intermediate circuit can be omitted from the equation (4) on the assumption that the resistance will not change significantly during the lifetime of the apparatus. The total resistance of the intermediate circuit depends on the resistance of the IGBT transistors of the bridges as well as on the diodes that are in parallel with them, in addition to the trimmer resistors. Also the power taken by possible DC choppers connected to the intermediate circuit must be taken into account. The measurement requires that it be repeated always within the limits of a certain pre-determined temperature range. This is because otherwise the changing electrical properties of the components in relation to temperature would produce considerable inaccuracy in the result. With the standardization of the measuring method it is possible to achieve good accuracy and thus to obtain reliable results.

When the frequency converter is in use in its final placement location a corresponding test can be repeated regularly, and in this way the condition of the capacitors of the intermediate circuit can be monitored. The application software analyzes the temperatures measured from the system and in this way defines a suitable time for a discharge test. The faster the change in measured voltage, the greater is the relative decrease in capacitance. When the change in capacitance compared to the value obtained in the factory instrumentation approaches the limit value given by the manufacturer, it is time to replace the capacitor pack or the whole frequency converter.

It is obvious that the different embodiments of the invention are not limited solely to the example described above, but that they may be varied within the scope of the claims presented below. The invention can also be applied to other power electronics appliances provided with a direct-current intermediate circuit, such as UPS apparatuses. A frequency converter may also comprise, according to the power requirement, two or more parallel generator bridges or network bridges, in which case the change in capacitance is calculated for the whole system.

The invention claimed is:

1. A method for monitoring a condition of a capacitor in a capacitor arrangement of a DC-voltage intermediate circuit of a power electronics appliance at a place of usage by measuring a DC voltage over the capacitor arrangement as the capacitor discharges the DC voltage as a function of time, the method comprising the following steps:
    pre-charging the capacitor in the intermediate circuit to a pre-determined DC voltage by using a pre-charging circuit,
    removing the pre-charging circuit from the intermediate circuit,
    measuring the DC voltage of the intermediate circuit by sampling at regular time intervals,
    determining a drop of the DC voltage as a function of time based on the measured DC voltage of the intermediate circuit,
    determining an actual capacitance value of the capacitor in the intermediate circuit based on the drop of the DC voltage,
    comparing the actual capacitance value of the capacitor, to a first pre-determined limit of the actual capacitance value of the capacitor, based on the drop of the DC voltage,
    performing a first necessary condition monitoring procedure when the actual capacitance value of the capacitor, as determined by a measurement of the DC voltage, indicates that the actual capacitance value of the capacitor is substantially close to the first pre-determined limit,
    determining the actual capacitance value of the capacitor in the intermediate circuit, and the pre-determined change of the actual capacitance value of the capacitor in the intermediate circuit with an equation as follows:

$$C_{tot} = \frac{-t}{R_{tot} \cdot \ln v}$$

where
    "$C_{tot}$" is the actual capacitance value of the intermediate circuit,
    "v" is a pre-determined change in the DC voltage of the intermediate circuit,
    "t" is a related discharge time, and
    "$R_{tot}$" is an actual resistance of trimmer resistors of the capacitor arrangement.

2. The method according to claim 1, measuring the DC voltage with an internal voltage measuring arrangement of the appliance.

3. The method according to claim 1, determining the first pre-determined limit of the actual capacitance value of the capacitor by testing the appliance by pre-charging the capacitor in the intermediate circuit with a specific DC voltage in a standard ambient temperature,
    removing the pre-charging circuit from the intermediate circuit, and
    monitoring how quickly the DC voltage of the intermediate circuit decreases with the measurements of the DC voltage, and then
    determining the actual capacitance value of the of the capacitor in the intermediate circuit in a control unit.

4. The method according to claim 3, recording the first pre-determined limit of the actual capacitance value of the capacitor in a memory of the control unit.

5. The method according to claim 1, calculating the pre-determined change of the actual capacitance value of the capacitor by omitting the actual resistance $R_{tot}$ of the trimmer resistors of the intermediate circuit from the equation $$C_{tot} = \frac{-t}{R_{tot} \cdot \ln v}.$$

6. The method according to claim 1, wherein the appliance is a frequency converter.

7. The method according to claim 1, wherein the capacitor comprises:
    multiple capacitors in series and parallel-connected capacitor packs, a part of which is a brake chopper unit.

8. A system for monitoring a condition of a capacitor in a capacitor arrangement of a DC-voltage intermediate circuit of a power electronics appliance at a place of usage, comprising:
    a control unit,
    a pre-charging circuit for pre-charging the capacitor in the intermediate circuit, and
    a measuring arrangement by which the DC voltage over the capacitor arrangement is measured in relation to time,
    wherein the control unit of the system is adapted:
    to pre-charge the capacitor in the intermediate circuit with a pre-determined DC voltage,
    to remove the pre-charge circuit from the intermediate circuit,
    to measure the DC voltage of the intermediate circuit at regular intervals,
    to determine a drop of the DC voltage based on the measured voltage of the intermediate circuit,
    to determine an actual capacitance value of the capacitor in the intermediate circuit based on the drop of the DC voltage, to compare the actual capacitance value of the capacitor to a first pre-determined limit based on the drop of the DC voltage, to perform a first necessary condition monitoring procedure when the actual capacitance value of the capacitor, as determined by a measurement of the DC voltage, indicates that the actual capacitance value of the capacitor is substantially close to the first pre-determined limit value, and to determine the actual capacitance value of the capacitor in the intermediate circuit, and to determine the pre-determined change of the actual capacitance value of the capacitor in the intermediate circuit with an equation as follows:

$$C_{tot} = \frac{-t}{R_{tot} \cdot \ln v}$$

where

"$C_{tot}$" is the actual value of the capacitance of the intermediate circuit,

"v" is a pre-determined change in the DC voltage of the intermediate circuit,

"t" is a related discharge time, and

"$R_{tot}$" is an actual resistance of trimmer resistors $T_r$ of the capacitor arrangement.

9. The system according to claim 8, wherein the system is adapted to measure the voltage with the measuring arrangement which is internal of the appliance.

10. The system according to claim 8, wherein the system is adapted:

to determine the first pre-determined limit of the actual capacitance value by testing the appliance by pre-charging the capacitor in the intermediate circuit with a specific DC voltage in a standard ambient temperature, and to measure how quickly the DC voltage of the intermediate circuit decreases by the measuring arrangement of the system, after which the actual capacitance of the capacitor in the intermediate circuit is determined in the control unit.

11. The system according to claim 10, wherein the first pre-determined limit of the actual capacitance value of the capacitor is recorded as a memory of the control unit.

12. The system according to claim 8, wherein the system is adapted to calculate the pre-determined change of the actual capacitance value of the capacitor by omitting the resistance $R_{tot}$ of the trimmer resistors $T_r$ of the intermediate circuit from the equation $$C_{tot} = \frac{-t}{R_{tot} \cdot \ln v}.$$

13. The system according to claim 8, wherein the appliance is a frequency converter.

14. The system according to claim 8, wherein the capacitor comprises:

multiple capacitors in series and parallel-connected capacitor packs, a part of which is a brake chopper unit.

15. A method for monitoring a condition of a capacitor in a capacitor arrangement of a DC-voltage intermediate circuit of a power electronics appliance at a place of usage by measuring a DC voltage over the capacitor arrangement as the capacitor discharges the DC voltage as a function of time, the method comprising the following steps:

pre-charging the capacitor in the intermediate circuit to a pre-determined DC voltage by using a pre-charging circuit, removing the pre-charging circuit from the intermediate circuit, measuring the DC voltage of the intermediate circuit by sampling at regular time intervals, determining a drop of the DC voltage as a function of time based on the measured DC voltage of the intermediate circuit, determining a pre-determined change of the actual capacitance value of the capacitor in the intermediate circuit based on a pre-determined change of the DC voltage, comparing the pre-determined change of the actual capacitance value of the capacitor to another pre-determined limit of the pre-determined change of the DC voltage, performing a second necessary condition monitoring procedure when the pre-determined change of the actual capacitance value of the capacitor, as determined by a measurement of the pre-determined change of the DC voltage, indicates that the pre-determined change of the actual capacitance value of the capacitor is substantially close to the another pre-determined limit, determining the actual capacitance value of the capacitor in the intermediate circuit, and the pre-determined change of the actual capacitance value of the capacitor in the intermediate circuit with an equation as follows:

$$C_{tot} = \frac{-t}{R_{tot} \cdot \ln v}$$

where

"Ctot" is the actual capacitance value of the intermediate circuit,

"v" is a pre-determined change in the DC voltage of the intermediate circuit,

"t" is a related discharge time, and

"Rtot" is an actual resistance of trimmer resistors of the capacitor arrangement.

16. The method according to claim 15, wherein the capacitor comprises:

multiple capacitors in series and parallel-connected capacitor packs, a part of which is a brake chopper unit.

* * * * *